(12) United States Patent
Ghosh et al.

(10) Patent No.: US 9,899,456 B2
(45) Date of Patent: Feb. 20, 2018

(54) LARGE AREA OLED MICRODISPLAY AND METHOD OF MANUFACTURING SAME

(71) Applicant: eMagin Corporation, Hopewell Junction, NY (US)

(72) Inventors: Amalkumar P. Ghosh, Hopewell Junction, NY (US); Andrew G. Sculley, Hopewell Junction, NY (US); Ihor Wacyk, Hopewell Junction, NY (US); Harrison Kwon, Hopewell Junction, NY (US); John Ho, Hopewell Junction, NY (US); Andrew Rosen, Hopewell Junction, NY (US)

(73) Assignee: eMagin Corporation, Hopewell Junction, NY (US)

( * ) Notice: Subject to any disclaimer, the term of this patent is extended or adjusted under 35 U.S.C. 154(b) by 0 days.

(21) Appl. No.: 15/144,142

(22) Filed: May 2, 2016

(65) Prior Publication Data

US 2016/0322434 A1    Nov. 3, 2016

Related U.S. Application Data

(60) Provisional application No. 62/155,821, filed on May 1, 2015.

(51) Int. Cl.
*H01L 27/32* (2006.01)

(52) U.S. Cl.
CPC ...... *H01L 27/3218* (2013.01); *H01L 27/3293* (2013.01)

(58) Field of Classification Search
CPC ......... H01L 2924/0002; H01L 2924/00; H01L 21/76877; H01L 21/82; H01L 23/585;

(Continued)

(56) References Cited

U.S. PATENT DOCUMENTS

| 5,711,693 A | 1/1998 | Nam et al. |
| 5,748,268 A | 5/1998 | Kalmanash |

(Continued)

FOREIGN PATENT DOCUMENTS

| CN | 202183373 U | 4/2012 |
| EP | 2830036 | 1/2015 |

(Continued)

OTHER PUBLICATIONS

Authorized Officer: Eli Sarit, "International Search Report" and "Written Opinion" dated Aug. 8, 2016 issued in counterpart PCT Application No. PCT/US2016/030414.

(Continued)

*Primary Examiner* — Roy Potter
*Assistant Examiner* — Paul Patton
(74) *Attorney, Agent, or Firm* — Kaplan Breyer Schwarz, LLP

(57) ABSTRACT

An organic light-emitting diode (OLED) display device is provided having a color emission layer including a plurality of organic light-emitting elements in a first arrangement and an electronics layer. The electronics layer includes a plurality of pixel drive circuits each including an electrode contact. The electronics layer includes a plurality of independently addressable sub-regions each sub-region including an identical pattern of electrode contacts created using a single reticle exposure. Each sub-region is orientated differently within a plane such that the first arrangement of light-emitting elements is electrically connected to the patterned electronics layer.

22 Claims, 15 Drawing Sheets

(58) Field of Classification Search
CPC ............. H01L 27/3218; H01L 27/3244; H01L 27/326; H01L 27/3293
See application file for complete search history.

(56) References Cited

U.S. PATENT DOCUMENTS

| | | | |
|---|---|---|---|
| 6,097,455 | A | 8/2000 | Babuka et al. |
| 6,498,692 | B1 | 12/2002 | Hassner et al. |
| 6,567,138 | B1 | 5/2003 | Krusius et al. |
| 6,967,111 | B1 | 11/2005 | Hata |
| 7,129,634 | B2 | 10/2006 | Boroson et al. |
| 7,394,194 | B2 | 7/2008 | Cok |
| 8,742,659 | B2 | 6/2014 | Chang |
| 8,796,740 | B1 | 8/2014 | Landis et al. |
| 9,123,266 | B2 | 9/2015 | Bastani et al. |
| 9,147,611 | B1 | 9/2015 | Landis et al. |
| 2002/0001026 | A1 | 1/2002 | Ishikawa et al. |
| 2002/0015110 | A1 | 2/2002 | Brown Elliott |
| 2002/0163301 | A1 | 11/2002 | Morley et al. |
| 2004/0195963 | A1 | 10/2004 | Choi et al. |
| 2005/0003633 | A1 | 1/2005 | Mahle et al. |
| 2006/0125506 | A1 | 6/2006 | Hara et al. |
| 2007/0108899 | A1 | 5/2007 | Jung et al. |
| 2007/0176859 | A1 | 8/2007 | Cok et al. |
| 2009/0035518 | A1 | 2/2009 | Wang et al. |
| 2009/0115970 | A1 | 5/2009 | Morejon et al. |
| 2014/0197379 | A1 | 7/2014 | Li |
| 2014/0313112 | A1 | 10/2014 | Madhusudan |
| 2015/0311269 | A1 | 10/2015 | Hsu et al. |
| 2016/0329385 | A1 | 11/2016 | Qiu et al. |
| 2017/0194389 | A1 | 7/2017 | Guo et al. |

FOREIGN PATENT DOCUMENTS

| | | | | |
|---|---|---|---|---|
| EP | 2830036 | A1 * | 1/2015 | ............... G09G 3/32 |
| WO | 2014043850 | A1 | 3/2014 | |
| WO | 2015101328 | A1 | 7/2015 | |

OTHER PUBLICATIONS

Eric F, "The Art of Making Large Image Sensors (or Quilting with Silicon)", "Imaging Blog", Feb. 7, 2012, Publisher: Teledyne Dalsa—http://blog.teledynedalsa.com/2012/02/the-art-of-making-large-image-sensors-or-quilting-with-silicon/, Published in: CA.
"Non-Final Office Action", U.S. Appl. No. 15/243,197, dated Sep. 28, 2017, 13 pp.

* cited by examiner

LARGE AREA OLED MICRODISPLAY AND METHOD OF MANUFACTURING SAME

CROSS-REFERENCE TO RELATED APPLICATION

This application claims the benefit of provisional patent application Ser. No. 62/155,821 filed in the United States Patent and Trademark Office on May 1, 2015, which is incorporated in its entirety by reference herein.

FIELD OF THE INVENTION

The present invention relates generally to organic light-emitting diode (OLED) display devices and, more particularly, to a large area display comprising more than one microdisplay panel having an active matrix organic light-emitting diode (AMOLED) pixel cell design and method of fabricating same.

BACKGROUND OF THE INVENTION

OLED display technology has the benefit of a wide operating temperature range, low power consumption, wide viewing angle, high contrast and fast response time making it the best choice for large area displays. While the demand for these displays continues to increase, the technology still remains expensive to produce and lacks in overall resolution and performance quality.

Traditional OLED displays include a stack of thin layers formed on a substrate. A light-emitting layer of a luminescent organic solid, as well as adjacent semiconductor layers, is sandwiched between a cathode and an anode. The light-emitting layer may be selected from any of a multitude of fluorescent and phosphorescent organic solids. Any of the layers, and particularly the light-emitting layer, also referred to herein as the emissive layer or the organic emissive layer, may consist of multiple sublayers. In an active-matrix organic light-emitting diode the cathode may include a metal electrode having low work function, and the anode may include a transparent electrode made from, for example, indium tin oxide (ITO) or.

In a typical OLED, either the cathode or the anode is transparent. Evaporation, spin casting, other appropriate polymer film-forming techniques, or chemical may form the films self-assembly. Thicknesses typically range from a few monolayers to about 1 to 2,000 angstroms. Protection of OLED against oxygen and moisture can be achieved by encapsulation of the device. The encapsulation can be obtained by means of a single thin-film layer situated on the substrate, surrounding the OLED.

In an OLED device, when an electric current is applied across the device negatively charged electrons move into the organic material(s) from the cathode. Positive charges, typically referred to as holes, move into the organic material(s) from the anode. The positive and negative charges meet in the center layers (i.e., the semiconducting organic material), combine, and produce photons. The wavelength, and consequently the color, of the photons depends on the electronic properties of the organic material in which the photons are generated. Pixel drivers can be configured as either current sources or voltage sources to control the amount of light generated by the OLEDs in an AMOLED display.

The color of light emitted from the organic light-emitting device can be controlled by the selection of the organic material. Generating blue, red and green light simultaneously may produce white light. Other individual colors, different than red, green and blue, can be also used to produce in combination a white spectrum. Specifically, the precise color of light emitted by a particular structure can be controlled both by selection of the organic material, as well as by selection of dopants in the organic emissive layers. Alternatively, filters of red, green or blue, or other colors, may be added on top of a white light-emitting pixel. In other examples, white light emitting OLED pixels may be used in monochromatic displays.

High-resolution active matrix displays may include millions of pixels and sub-pixels that are individually addressed by the drive electronics. Each sub-pixel can have several semiconductor transistors and other IC components. Each OLED may correspond to a pixel or a sub-pixel. Generally, however, an OLED display consists of many OLED pixels, and each OLED pixel may have three sub-pixels associated with it, in which each sub-pixel may include red, green and blue color OLEDs or may emit white light, which be filtered to either red, green or blue.

Some structures for forming a full color image using an OELD device are generally known. For example, as shown in FIG. 1A, an independent red, green, blue (RGB) layer structure uses three organic luminescent layers 20, 22, and 24 independently coated on a substrate 10 for emitting red, green, and blue light respectively. As shown in FIG. 1B, a color transformation structure uses color transformation layers 30, 32, and 34 interposed between the substrate 10 and a blue luminescent layer 36. As shown in FIG. 1C, a color filter structure uses color filters 40, 42, and 44 for emitting the red, green and blue light respectively. The color filters 40, 42, and 44 are interposed between the substrate 10 and a white organic luminescent layer 46.

When using the independent RGB layer structure shown in FIG. 1A, the RGB material is deposited and patterned using a shadow mask. As a result, although there is high light efficiency, the red, green and blue light cannot be minutely separated from each other. The color transformation structure shown in FIG. 1B requires that an organic fluorescent material is deposited on the substrate by an exposure process, thereby adding a process step for forming the full color image. In addition, when using the color transformation structure, it is difficult to coat the color transformation layer with a uniform thickness. When using the color filter structure shown in FIG. 1C, the color filter is formed through a conventional photolithography process. As a result, a relatively higher resolution display panel is manufactured using the color filter structure and the color filter structure is more widely used than the other structures.

The OLED display of the present invention utilizes a new OLED architecture with a unique pixel design and pattern of electrode connections through vias. A "via" is a vertical electrical connection between different layers of conductors in a physical electronic circuit. In the present invention, electrical connections to and from OLED displays are provided to each anode line and cathode line by at least one via. Each via is formed of a column of conductive material or in its simplest form provided as an opening leaving free access to the electrode beneath.

One method used to fabricate large area displays is referred to as tiling. In tiling, a plurality of smaller displays are arranged in a matrix to create large, high-resolution, multi-panel displays. Typically, tiling to obtain large area displays rely upon the stitching of multiple tiles together, wherein each tile has a pixel or an array thereof. However, the edge line of these assembled tiled displays produce visually disturbing seams, resulting from the gaps between adjacent pixels on adjacent tiles. The interconnections necessary to supply signals to the display may also be noticeable, distract the viewer, and otherwise detract from the overall visual appearance of the image. Therefore, it is desirable to fabricate tiled, high-resolution, micro-panel displays, which do not have noticeable or perceptible seams under the intended viewing conditions.

Flat-panel displays (FPDs) provide the best choice for constructing "seamless", tiled screens however, FPDs depend on the micro fabrication of components that carry the pixel patterns, which are not viable for very large displays. Therefore, the inventors have determined that tiles with arrays of OLED pixels can be micro fabricated and then assembled together to form a larger area electronic display. The present invention provides unique designs and methods for achieving such large, seamless, tiled panels for full color, high-resolution large area displays. In particular, these large area displays measure approximately 1 to 3 inches per side and are ideal for, amongst other things, high-resolution displays in demand for virtual reality device (e.g. headsets).

Early image sensor technology was manufactured using micron lithography such that an entire wafer was exposed in a single shot. During that time, feature sizes were large and wafers small enough so that a photomask as large as the wafer itself could project onto the wafer precisely enough to reproduce the required features. Once silicon processes were used for submicron feature sizes and wafer sizes increased, image sensors could no longer be made as large as the wafer itself in one shot. Lithography moved to smaller masks and wafer exposure to "step and repeat" methods, such that a single exposure could only result in a device in the order of 25 mm×25 mm. This created the need for stitching, which was developed in order to build a device from a sequence of exposures resulting in a device much larger than the size of a single mask. A typical pixel array is formed from blocks of a few thousand pixels. The mask contains a single instance of this block, and by stepping the mask the equivalent of the block size, the pixel block can be repeated side by side on the surface of the wafer. Multiple dies can be formed on the wafer and in some cases, multiple die patterns can be included in a single reticle to reduce the cost of the reticle set. The circuitry that surrounds the pixel is then added to complete the device. Using this method, a single mask can be used to manufacture large area devices.

It is a primary object of the present invention to provide a large area display comprised of more than one AMOLED microdisplay panel fabricated using a single reticle to create a variety of different display devices with different configurations.

It is another object of the present invention to provide a large area display preferably comprised of, but not limited to, four AMOLED microdisplay panels arranged together which are independently addressable and avoid the necessity of stitching together layers.

It is another object of the present invention to provide a high-resolution display comprised of more than one AMO-LED microdisplay for use in virtual reality, high-speed and/or head mounted devices and applications.

SUMMARY OF THE INVENTION

The present invention cures some of the deficiencies in the prior art by providing a large area display having more than one AMOLED microdisplay panel fabricated using a single reticle for allowing simpler and less expensive manufacturing of large area electronic displays.

In accordance with an illustrative embodiment of the present invention, an organic light-emitting diode (OLED) display is provided having an emission layer having a plurality of light-emitting elements, and an electronics layer. The electronics layer includes a plurality of independently addressable display panels, wherein each panel is identically patterned and arranged in a different orientation and operatively connected to the emission layer. The emission layer includes an array of light-emitting elements arranged in a vertically repetitive sequence across the entire color emission layer. The electronics layer may be patterned using a single reticle exposure.

In accordance with an illustrative embodiment of the present invention, an organic light-emitting diode (OLED) display device is provided having a color emission layer including a plurality of organic light-emitting elements in a first arrangement, and an electronics layer. The electronics layer includes a plurality of pixel drive circuits each including an electrode contact, wherein the electronics layer includes a plurality of independently addressable sub-regions each sub-region including an identical pattern of electrode contacts. Each sub-region is orientated differently within a plane, such that the first arrangement of light-emitting elements is electrically connected to the patterned electronics layer. The first arrangement of organic light-emitting elements are arranged in a vertically repetitive sequence across the entire color emission layer. The pixel circuit may be a single-crystal silicon circuit. Each sub-region of the electronics layer may be an OLED microdisplay panel. Each microdisplay panel may include a plurality of logic blocks and a plurality of fixed resource blocks. Adjacent sub-regions of the electronics layer may be orientated differently in the plane by flipping about the axis of symmetry. Adjacent sub-regions of the electronics layer may be orientated differently in the plane by rotating ninety degrees therefrom. Each sub-region of the electronics layer includes a pattern of electrode contacts electrically connected to provide conduction to individual OLED elements within the emission layer. The pattern of electrode contacts may be arranged along a diagonal across each OLED element. The OLED elements may include an array of light-emitting pixels having organic layers, which produce colors defining a color gamut. The colors produced by the color gamut defining pixels may be red, green and blue. The OLED device may further comprise a different color filter associated with each of the color gamut defining pixels. Each pattern of sub-regions of the electronics layer may be created using a single reticle exposure. The OLED display device may be an active matrix device or a passive matrix device. The OLED display device may be top emitting or bottom emitting.

In accordance with an illustrative embodiment of the present invention, a method of manufacturing an organic light-emitting diode display device is provided. The method includes assembling a plurality of independently addressable display panels in an array, each of the panels having a color emission layer including a plurality of organic light-emitting elements each having a contact and patterned in a first arrangement. The method further includes assembling an electronics layer having a plurality of differently orientated sub-regions created using a single reticle exposure, by forming a plurality of single-crystal silicon pixel drive circuits adapted to provide a plurality of electrical signals for activating one of the plurality of corresponding organic light-emitting elements of the color emission layer, forming a plurality of electrode contacts coupled to receive the plurality of electrical signals provided by the pixel drive circuitry, and forming a plurality of vias for coupling the plurality of electrode contacts to the plurality of the organic light-emitting element contacts. The method further includes coupling the patterned first arrangement of light-emitting elements to the patterned electronics layer by the plurality of vias.

The method may include forming a plurality of electrode contacts further comprising forming a conductive layer on a transparent substrate, and etching the conducting layer to produce an electrode pattern by means of photolithography so as to form a plurality of electrodes on the transparent substrate. The method may include aligning the pattern of electrodes with the patterned first arrangement of light-emitting elements of the color emission layer. The electronics layer may be produced using small area photo exposure tools including a mask. The electronics layer may be formed formed using continuous die patterning.

These advantages of the present invention will be apparent from the following disclosure and the appended claims.

BRIEF DESCRIPTION OF THE DRAWINGS

To these and to such other objects that may hereinafter appear, the present invention relates to a large area OLED microdisplays and method of manufacturing same as described in detail in the following specification and recited in the annexed claims, taken together with the accompanying drawings, in which like numerals refer to like parts in which:

DETAILED DESCRIPTION

Figure 3:
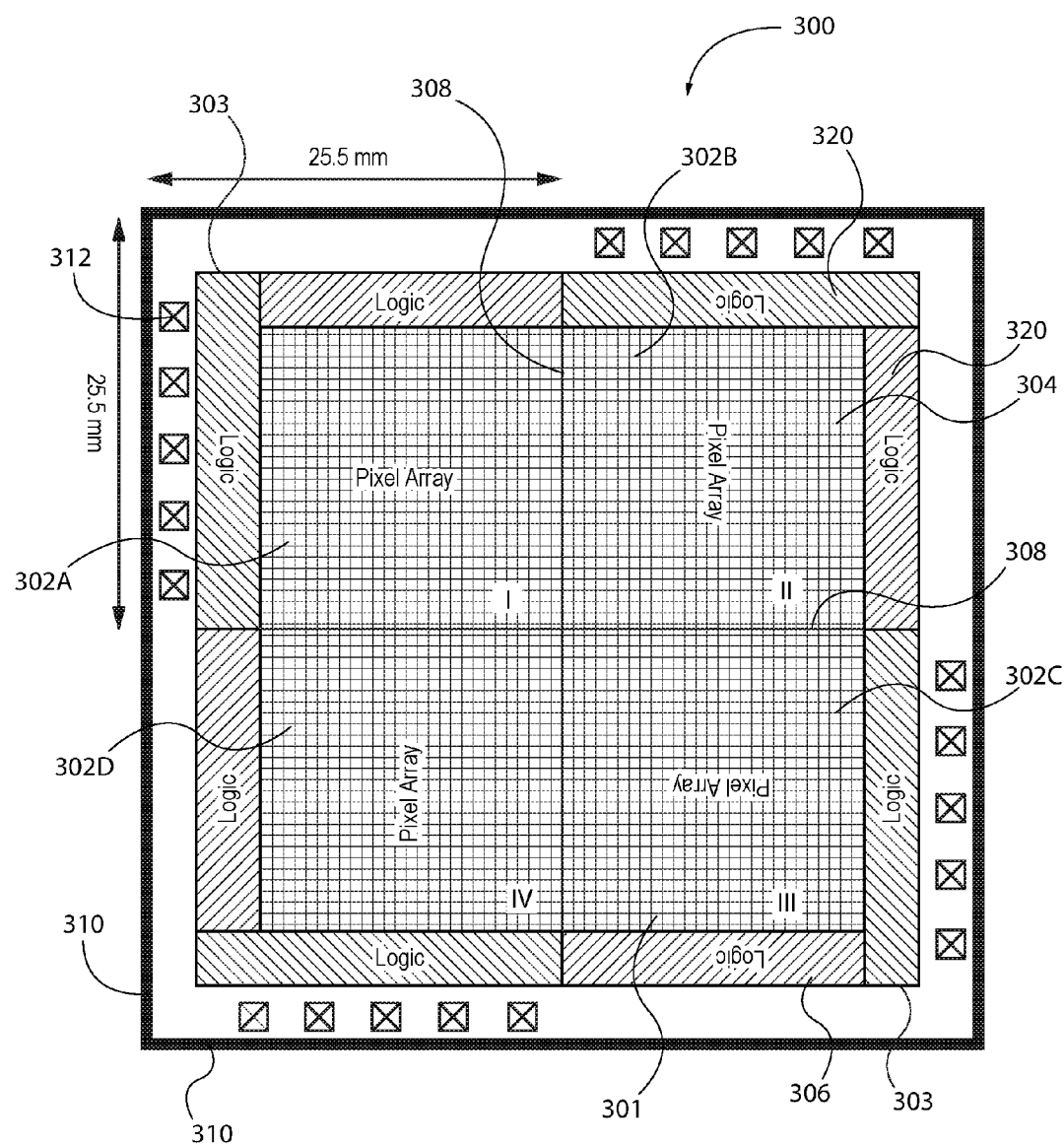
FIG. 3 is a schematic view showing a large format display made with a single reticle in accordance with an illustrative embodiment of the present invention.
Figure 4:
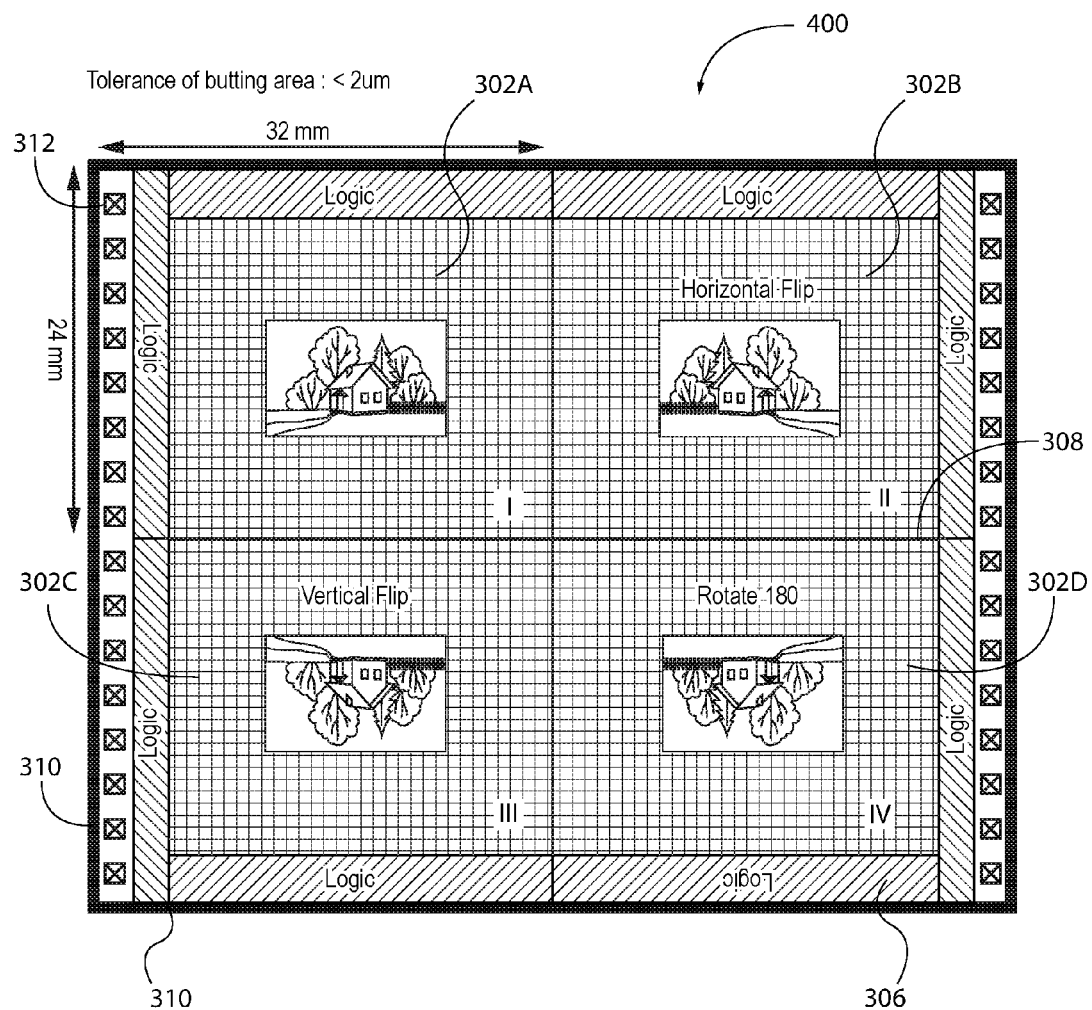
FIG. 4 is a schematic view showing a large format display made with a single reticle in accordance with another embodiment of the present invention.

FIGS. 3 and 4 illustrate a multi-panel display device formed from the tiling of multiple OLED microdisplay panels together to achieve a large area. In its broadest context, the display device includes multiple panels each having an electronics layer having a plurality of identically patterned sub-regions orientated differently within the plane, and one or more emission layers operatively connected to each electronics layer. It should be noted that the display device described in the various embodiments of the invention are for illustrative purposes and the present invention is not limited to the specific devices described herein.

FIGS. 2A-2D illustrate semiconductor processing where integrated circuits are fabricated on semiconductor wafers 200, preferably silicon wafers. In the process, a stepper machine is used to print images on a wafer. The images on the wafer are mounted and cut into rectangular pieces called dies. The dies are formed side-by-side on the semiconductor wafer by exposing a pattern on the photomask, called a reticle 210. The reticle is a transparent substrate, such as quartz, that is placed the near focal plane of a projection system. Radiation, such as ultra violet light, is passed through the reticle, to define the image being projected. The image consists of one or more die and various test and measurement structures between and around the die. Each die includes a primary die area that is patterned according to an integrated circuit design. Each die also includes test structures. Test structures are typically formed on a wafer in thin vertical and horizontal scribe lines (also referred to herein as scribe lanes) situated between adjacent primary die. The test structures include some or all of the processing layers used to form the integrated circuit.

Figure 1A:
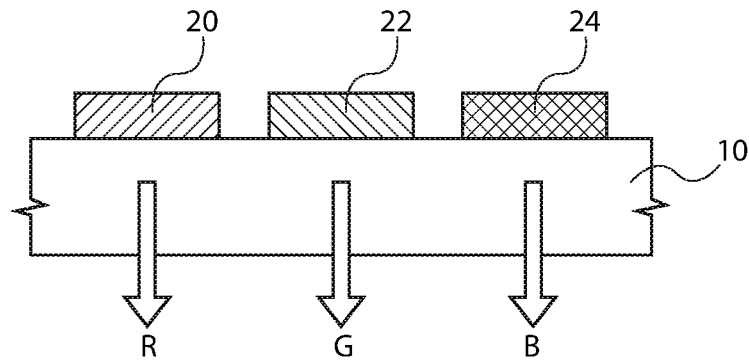
FIGS. 1A-1C are schematic views showing conventional structures for forming a color image in an OLED device.
Figure 1B:
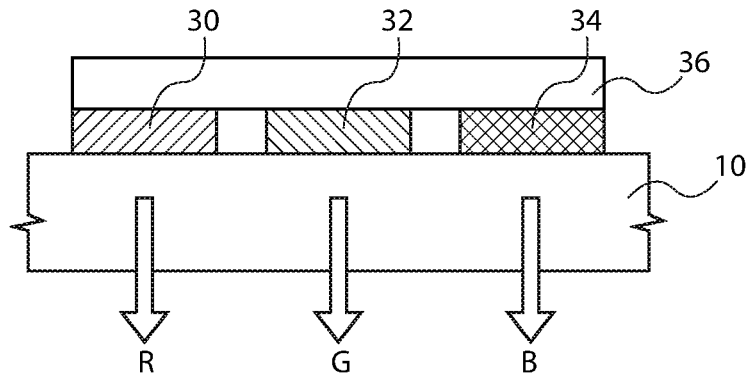
Figure 1C:
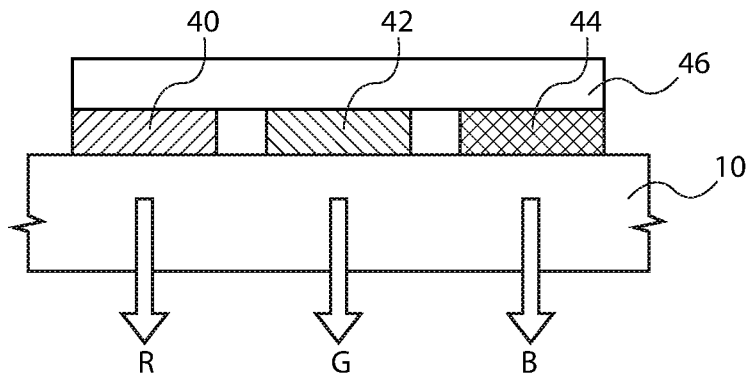
Figure 2A:
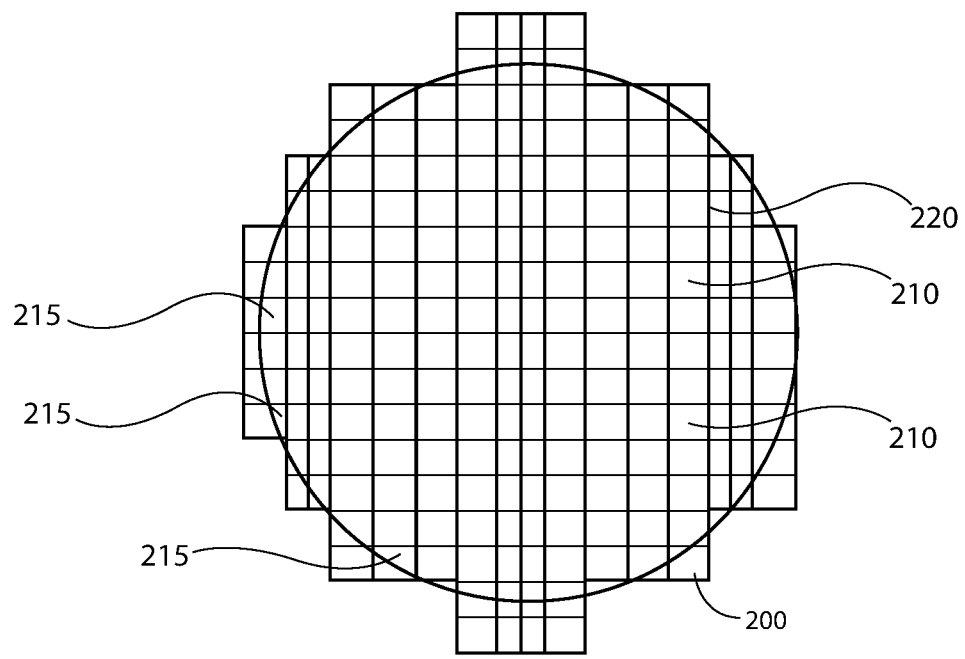
FIGS. 2A-2C are diagrammatic top views showing a conventional wafer structure with reticle design in accordance with an illustrative embodiment of the present invention.

FIG. 2A illustrates a conventional single-crystal wafer 200 that has been organized into multiple identical patterns, each consisting of geometric data present on the reticle. Though the term "reticle" literally applies to the tooling used to pattern the wafer, herein we shall also use the term to signify the portion of a wafer uniquely fabricated from this pattern.

Cost-effective silicon substrate use and wafer-level processing require that a single wafer yield as many usable integrated circuits or dies, as possible. In order for this to be possible, minimizing damage to the dies is important when sawing through scribe sheets. Several parameters are controlled in order to provide a precise cut. The arrangement of dies on the wafer surface and the corresponding scribe sheets are shown in FIG. 2A. The single-crystal wafers 200 are generally circular with the integrated circuits 210 constructed thereon, which are separated from one another by a grid formed by scribe lanes 220. As illustrated in FIG. 2A, usable wafer area is limited by the circular shape of the periphery and the number and width of the scribe lanes, which results in partial non-functional devices 215.

Figure 2B:
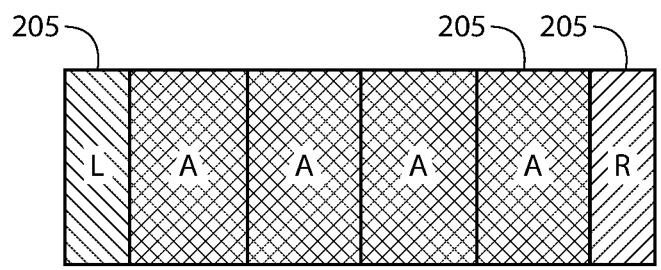
Figure 2C:
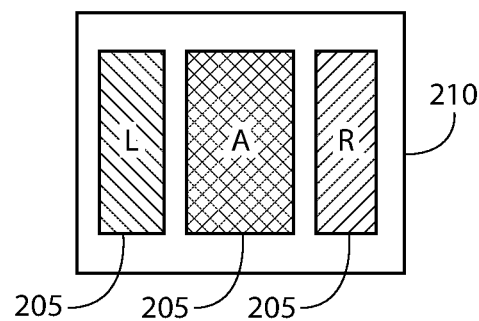

FIGS. 2B and 2C have labeled single reticles "L", "A", and "R". Each reticle typically contains multiple semiconductor chips (e.g. identically designed). Breaking down the design of the wafer as a whole into an array of sub-blocks or sub-fields within a reticle allows for "step-and-repeat" processes that are applied to the wafer during the manufacture of its semiconductor chips (e.g., photolithography). FIG. 2B illustrates partitioning of the design into multiple sub-blocks 205, while FIG. 2C illustrates placement of the sub-blocks 205 in the reticle 210 as sub-fields. A plurality of sub-fields 205 may fit on a single reticle 210. Some sub-fields 205 may be repeated multiple times within a reticle 210 and all sub-fields 205 are electrically coupled.

Figure 2D:
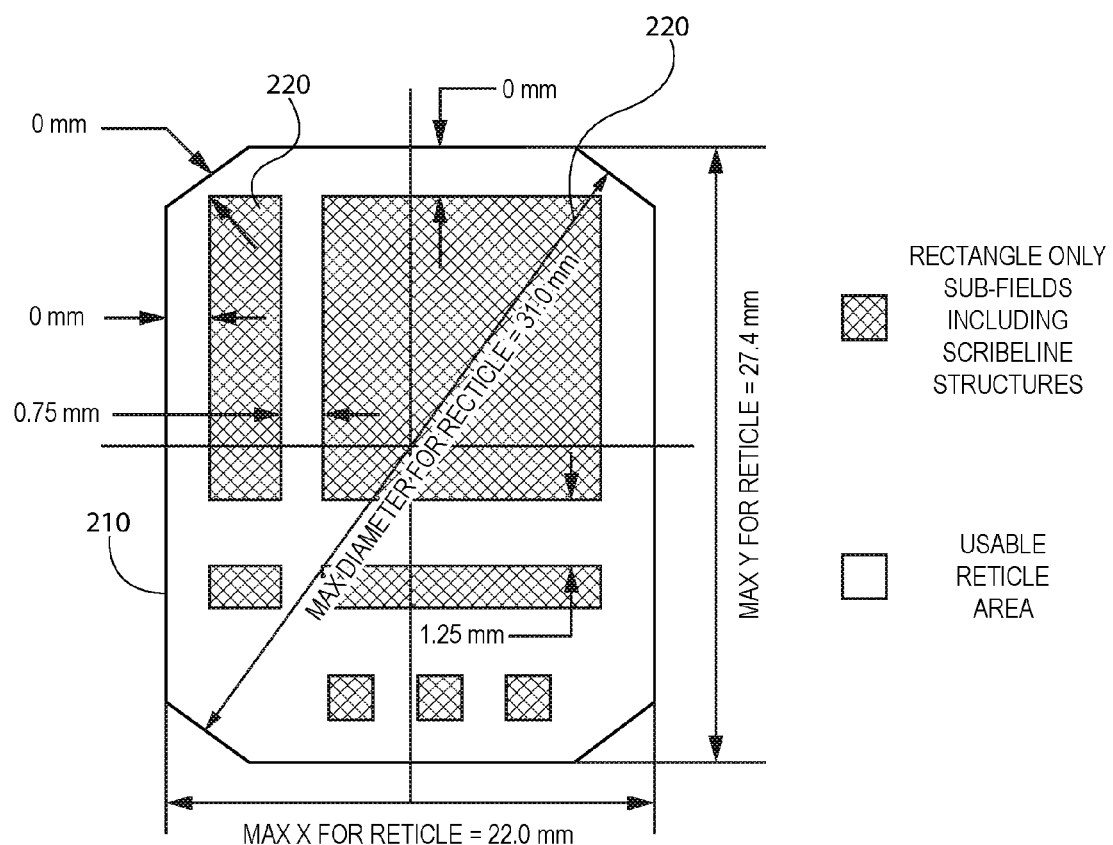
FIG. 2D is an enlarged top view showing a single die reticle field area that includes sub-fields and scribe lines in accordance with an illustrative embodiment of the present invention.
Figure 2E:
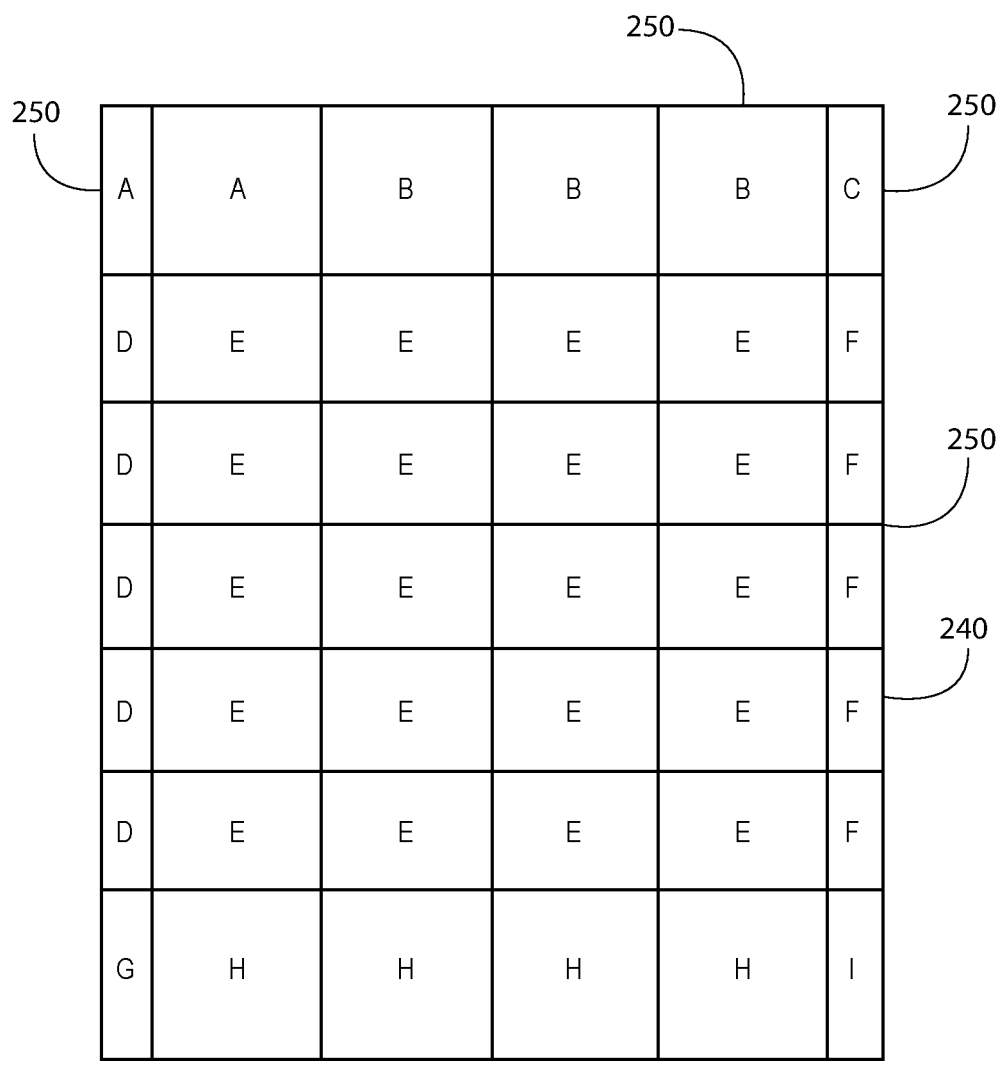
FIG. 2E is a diagrammatic top view showing a semiconductor wafer having a plurality of integrated circuit dies formed thereon in accordance with an illustrative embodiment of the present invention.

FIG. 2D illustrates a single reticle 210 having a plurality of sub-fields 220 including scribe line structures. Different design rules are applied at the boundaries due to misalignment tolerances, which adds considerable complexity to the layout architecture. FIG. 2E illustrates an example of a stitched display device consisting of a plurality of sub-fields 250.

Referring to FIG. 3, the display device 300 includes an emissive area 301 divided into four quadrants, I, II, III, IV composed using a single reticle exposure (e.g. FIG. 2D). Each quadrant represents a separate and independently controlled microdisplay panel 302A, 302B, 302C, and 302D. Each microdisplay panel 302 comprises a plurality of light-emitting elements each arranged in an array laid out over a substrate. Individual images displayed by each microdisplay panel 302 may constitute a sub-region of the larger overall composite image collectively displayed by the full color multi-panel display device 300.

According to the present invention, expensive costs of the masks in semiconductor processing is greatly reduced by using a single mask set for multiple die sizes, thereby reducing the cost of silicon and improving the resulting die per wafer. Multiple panels, or tiles, are exposed in a single reticle, and each placed adjacent one another to form a larger device or array. The panels of the present invention are independently addressable and may be, but are not necessarily, wired through the scribe region between adjacent panels.

The microdisplay panels 302 are tiled to define the display device 300 and form a peripheral edge 306 with internal seams 308. The seams 308 are formed along internal boundaries between adjacent panels 302. Scribe lanes 310 surround the peripheral edge 306 of the display device. Each of the panels 302 includes a number of sub-fields 320, which may include fixed resource blocks and multiple logic blocks 303. The fixed resource blocks can include a plurality driver circuits, auxiliary circuits, transceiver blocks, I/O banks, and a memory block. The logic blocks 303 can contain logic cells or gates configured to implement the intended logic functionality. The panels 302 may be connected to one or more adjacent panels through interconnect lines that enable the fixed resource blocks and logic blocks in one panel to communicate with the fixed resource and logic blocks in an adjacent panel. Pads 312 are disposed on one peripheral edge of each panel 302 of the display device, while electrical connections are disposed on one or both of the other peripheral edges. In this case, electrical connections between the individual panels 302 within the device after the tiling process are not required. It is to be understood that none, some, or all of the backplane layers and/or organic layers could be conventionally stitched.

FIG. 3 illustrates the exemplary tile combination of a 2×2 panel arrangement using a single reticle exposure. Each reticle exposure measure 25.5 mm×25.5 mm. Each reticle exposure has a plurality of sub-fields (e.g. FIG. 2D). One skilled in the art should appreciate that the number of sub-fields in a single reticle exposure is based on the size of the panel and reticle used. Thus, the maximum size of a die that can be produced is dependent upon the maximum reticle exposure size.

The OLED display device shown in FIG. 3 is formed using a single reticle that is rotated 90 degrees between each exposure. Traditionally, the red, green, and blue (RGB) color pixel arrangement is used where contact of the anode of each sub-pixel occurs across the central axis of each pixel unit (shown in FIG. 6). According to this embodiment, which is described in further detail in FIG. 7, a conventional RGB color pixel arrangement is patterned consistently across the entire display. Each of the four quadrants I, II, III, and IV require the rendered data to be rotated 90 degrees before being applied to the display for imaging. In particular, the reticle is exposed to quadrant I, rotated 90 degrees and exposed to quadrant II, rotated 90 degrees and exposed to quadrant III, and rotated another 90 degrees and exposed to quadrant IV.

FIG. 4 is a schematic view showing a multi-panel display device 400 according to another embodiment of the present invention. The display device according to this embodiment is identical to the display device according to the embodiment described with reference to FIG. 3 except that the single reticle is orientated differently within exposures such that the fixed resource blocks, multiple logic blocks, and electrical connections are arranged in a different manner. In FIG. 4, the same reference numerals denote the same elements as in FIG. 3, and detailed descriptions of same elements are omitted.

FIG. 4 illustrates another tile combination of a 2×2 panel arrangement using a single reticle exposure. Each reticle exposure measures 24 mm×32 mm. The tolerance of the butting area is less than 2 um. According to this embodiment, a conventional RGB color pixel arrangement may be patterned consistently across the entire display. The arrangement is such that the reticle is exposed to quadrant I, flipped and exposed to quadrant II, rotated 180 degrees and exposed to quadrant III, and flipped and exposed to quadrant IV.

Figure 5:
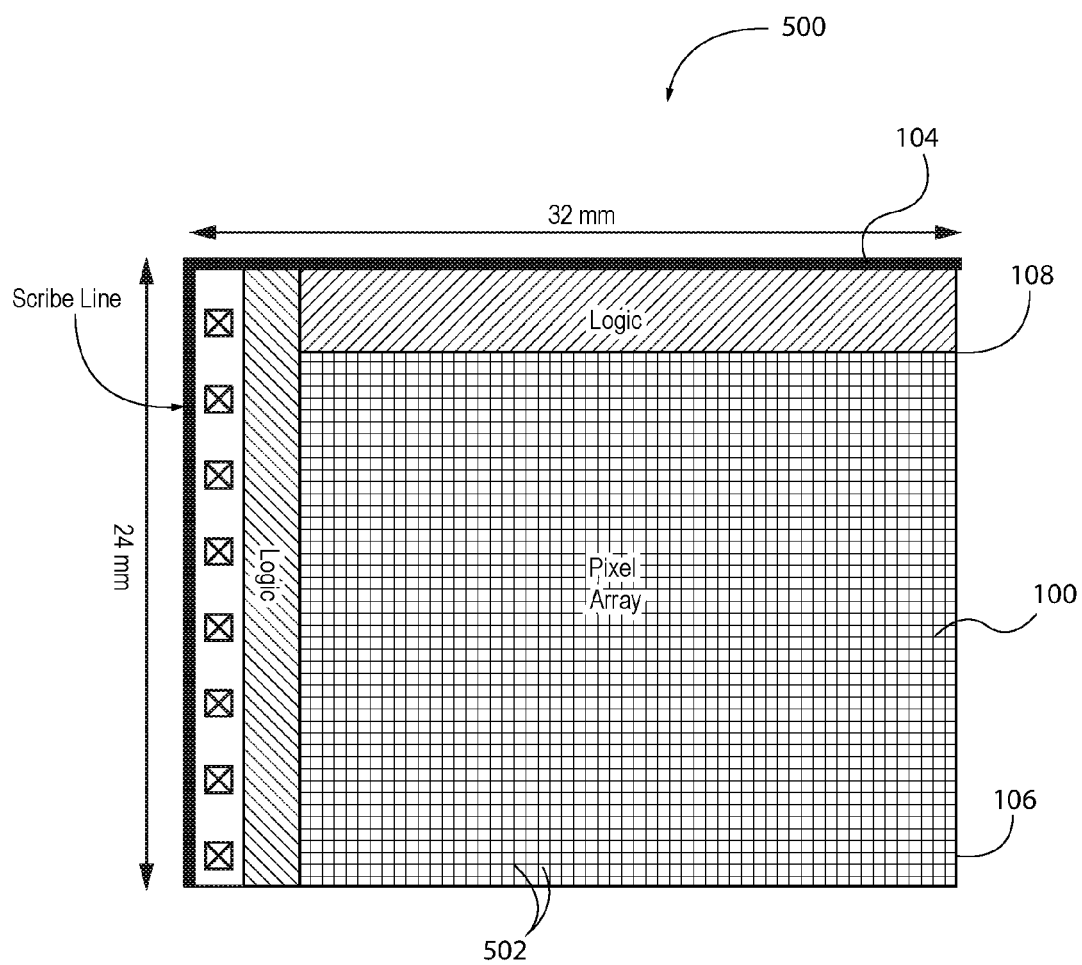
FIG. 5 is an enlarged view of a single reticle in accordance with the large format display of FIG. 4.

FIG. 5 illustrates a demonstrative layout of a pixel array 500 on display layer 502 in accordance with the multi-panel display device 400 of FIG. 4. The pixel array 500 is one possible implementation of the emissive area 301 of quadrant I of the device illustrated in FIG. 4.

Figure 6:
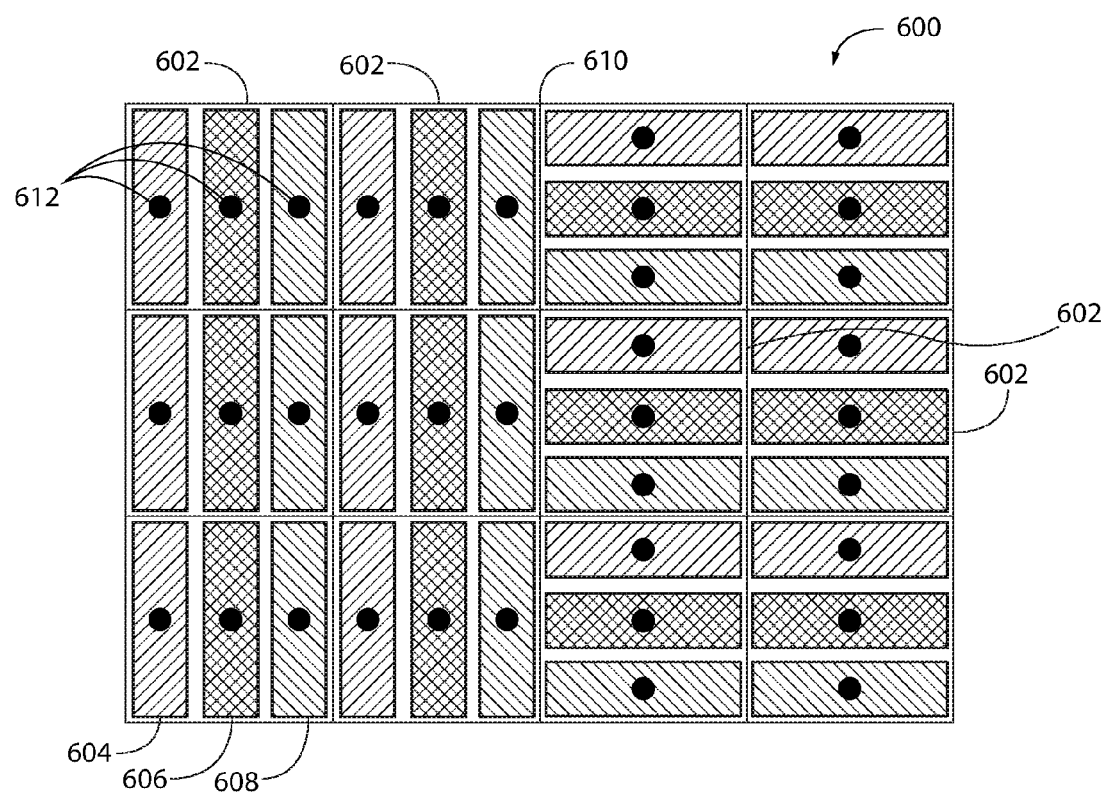
FIG. 6 is a schematic view showing a pixel arrangement with anode pattern for forming a color image in accordance with conventional OLED display devices.

FIG. 6 illustrates a conventional pixel arrangement 600 in an OLED display device. The arrangement 600 is composed of a number of pixel units 602 each including at least one light-emitting element configured to emit light. Each pixel unit 602 in the display device has at least three organic light-emitting diode (OLED) sub-pixels. The three OLED sub-pixels are a red (R) OLED sub-pixel 604, a green (G) OLED sub-pixel 606, and a blue (B) OLED sub-pixel 608, which emit red, green and blue light respectively, and which define a gamut of the display device. The commonly used red, green, and blue (RGB) OLED sub-pixels are described as an example of the three OLED sub-pixels. In other embodiments, OLED sub-pixels of other three colors may be used, or alternatively a white (W) OLED sub-pixel or a yellow (Y) OLED sub-pixel may be selected as one or more of the OLED sub-pixels.

In accordance with the display device provided by the present invention, one pixel unit 602 includes three OLED sub-pixels of different colors, wherein the plurality of pixels are arranged in an array each defining one panel. According to this embodiment, contact 612 to the anode is positioned centrally within each sub-pixel 604, 606, and 608, thereby arranging all contacts 612 within a pixel unit 602 in a straight line, and all contacts 612 within a quadrant in uniform rows or columns. The three OLED sub-pixels may be arranged in a straight line (as shown in FIG. 6) or in other embodiments arranged in a square, diamond, or any other form according to actual requirements (not shown).

Referring to FIG. 6, the seam 610 formed between the boundary of two rotated quadrants, specifically the seam between quadrant I and quadrant II, the seam between quadrant II and quadrant III, and the seam between quadrant III and IV, create a strong visual artifact resulting from the change in direction of the color filter arrangement. In quadrants I and III the color filter stripes run in a vertical direction, while in quadrants II and IV the color filter strips run in a horizontal direction, this visual discontinuity is eliminated by the method of the present invention resulting in the configuration illustrated in FIG. 7.

Figure 7:
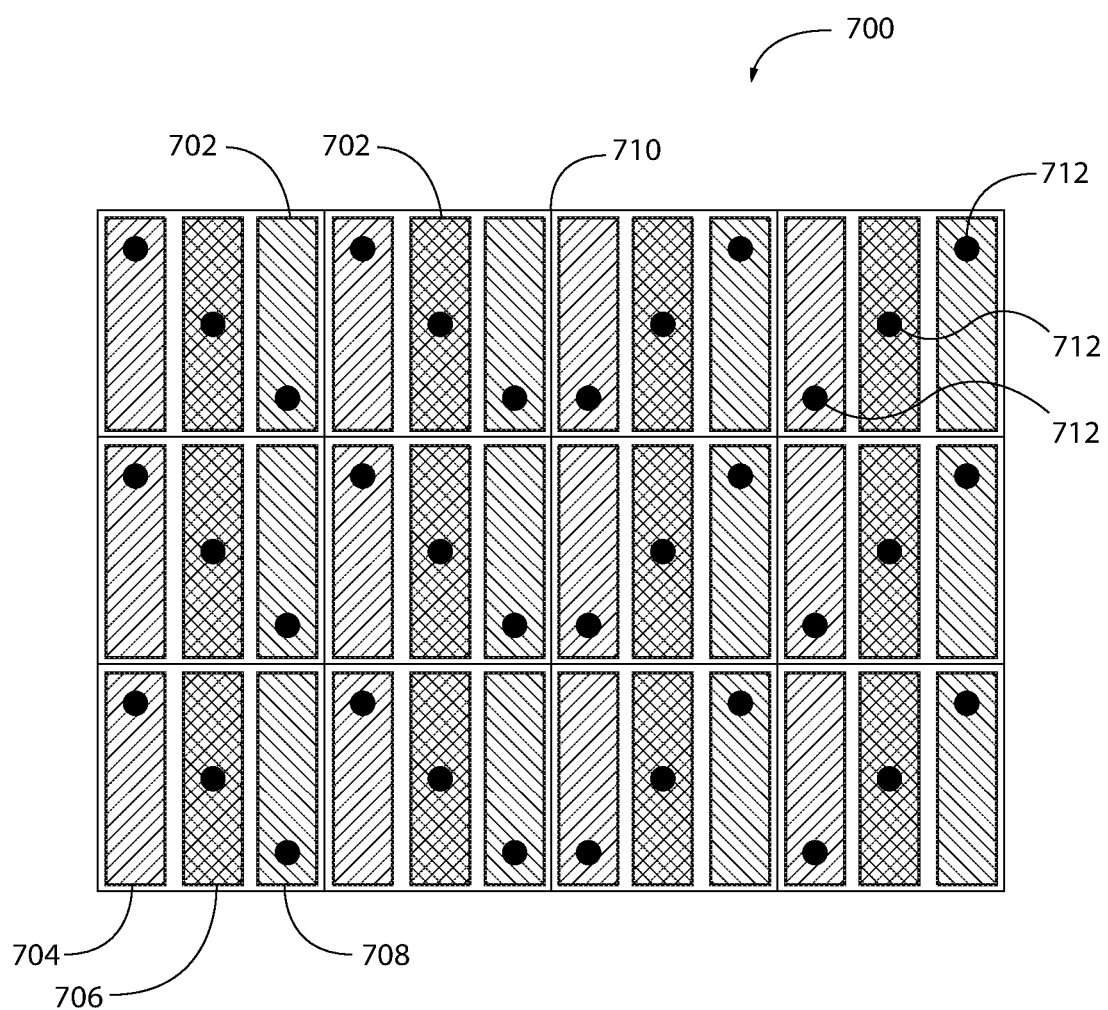
FIG. 7 is a schematic view showing a pixel arrangement with anode pattern for forming a color image in accordance with the large format display of FIG. 3.

FIG. 7 illustrates an improved pixel arrangement 700 in accordance with the OLED display device referenced in FIG. 3. According to this embodiment, contact 712 to the anode of each sub-pixel 704, 706, 708 within a pixel unit 702 is shifted vertically to define an overall diagonal pattern within each quadrant. Each of the four quadrants thereby allows the single anode pattern to be exposed in the same vertical pattern. The RGB color strip pattern extends vertically across the entire display, no longer creating a visible seam 710, such that no visual artifact results between the quadrants.

Figure 8:
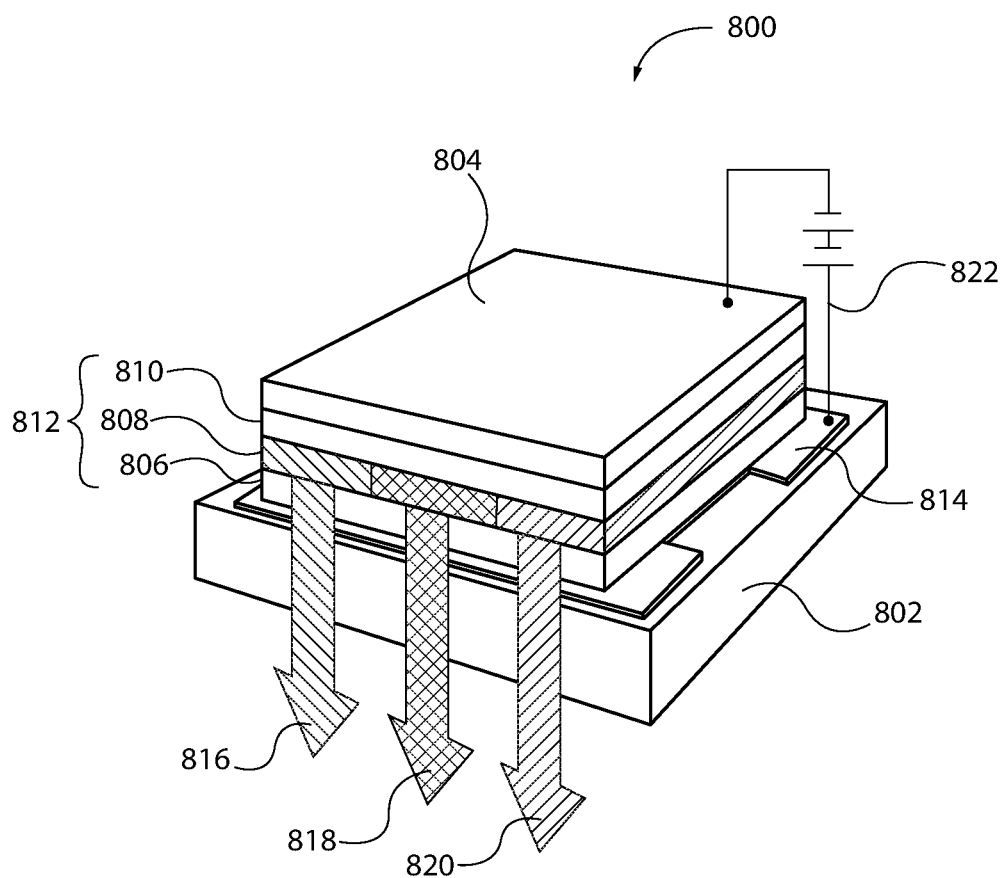
FIG. 8 is a sectional view of an idealized bottom-emitting OLED microdisplay device.
Figure 9:
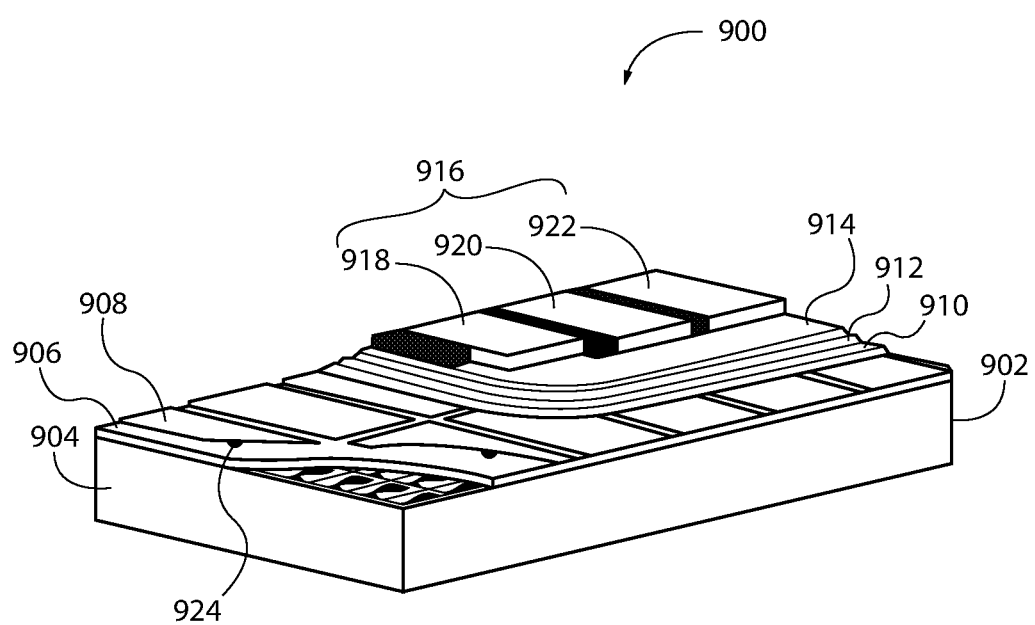
FIG. 9 is a sectional view of an idealized top-emitting AMOLED microdisplay device including the location of electrical contact between the anodes and subpixels.

FIGS. 8 and 9 illustrate structural views of an OLED display device according to various embodiments of the present invention. It should be understood, however, that various embodiments of the present disclosure may be implemented on other types of transmissive or emissive displays.

Referring to FIG. 8, a single display pixel is illustrated in accordance with an OLED display device 800 having a transparent substrate 802, a first electrode 804 and a second electrode 814 having one or more organic electroluminescent layers 812 formed therebetween. At least one electroluminescent layer being light-emitting and at least one of the electrodes being transparent, the first and second electrodes defining one or more light-emissive areas. The electrodes may be considered row and column electrodes in a passive-matrix control scheme (not shown) or as anode and cathode in an active-matrix control scheme (as shown) with thin-film circuitry provided between the electrical connectors and the electrodes. It should be understood that other generation type OLED display devices known to those of ordinary skill in the art may be utilized, and that this invention is not limited to the specific structure described herein.

The organic electroluminescent layers 812 are activated by applying a voltage 822 across the first and second electrodes 804 and 814 to emit light. The organic electroluminescent layers 812 may include an organic hole-injecting layer 806, an organic electron-transporting layer 810, and an organic light-emitting layer 808 (color emission layer) disposed between the organic hole-injecting layer 806 and the organic electron-transporting layer 810. The organic light-emitting layer 808 is preferably comprised of red (R) luminescent layer 816, a green (G) luminescent layer 818, and a blue (B) luminescent layer 820, which emit red, green and blue light respectively.

Referring to FIG. 9, the OLED display device is an idealized structure of a top-emitting active matrix organic light emitting diode (AMOLED) microdisplay 900 fabricated onto controlling and processing circuitry. The OLED display device is similar to the OLED display device illustrated in FIG. 8, except that the OLED display device of 9 is a top-emitting type OLED display device, wherein light for displaying an image is generated at a top portion of the OLED display device and is provided upwards. As the OLED display device of FIG. 9 is top-emitting, the first and second electrodes 908 and 912 function as the anode and cathode respectively. The device 900 includes a single crystal silicon substrate layer 902 with integrated active matrix drives 904, a polarized insular layer 906 with vias above the substrate layer 902, and individual anode electrodes 908 for each color sub-pixel positioned above the insular layer 906. A white light emitting OLED layer 910 is deposited onto the anode layer 908, followed by a cathode layer 912 deposited on the OLED layer 910. One or more transparent seal layers 914 cover the cathode layer 912. Color filter layer 916 including a red color filter strip 918, a green color filter strip 920, and a blue color filter 922 are deposited onto the seal layers 914 and covered by a transparent protective layer or antireflective layer (not shown). Contact 924 to the anode is positioned within each sub-pixel.

FIGS. 10-13 illustrate structural views of an OLED display device having thin-film-transistor (TFT) backplane technology in lieu of OLED backplanes utilizing single crystal silicon circuits as described above. It should be understood, however, that these other embodiments may be implemented on other generation type OLED display devices, and that this invention is not limited to the specific structure described herein. The OLED display device with TFT backplane forms a full color image using RGB layer structures.

Figure 10:
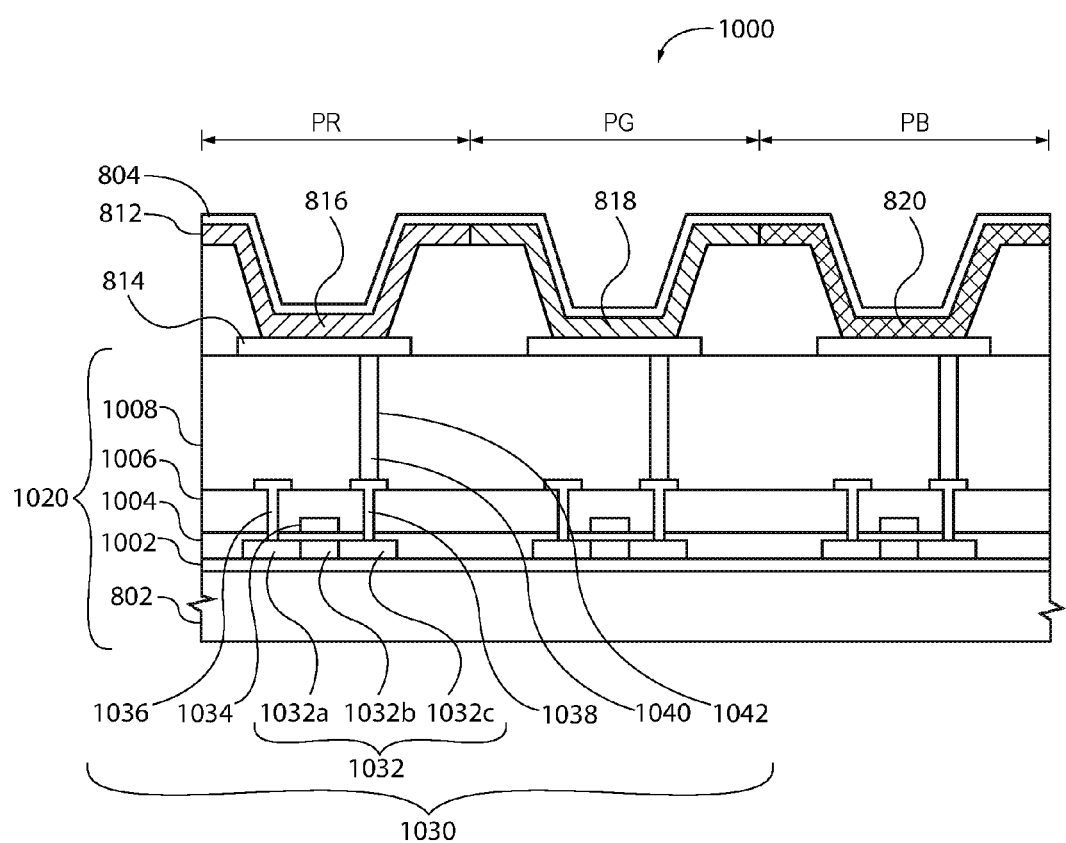
FIG. 10 is a cross-sectional view of a bottom-emitting OLED display device forming a full color image with independent red, green, and blue layer structure, in accordance with another embodiment of the present invention.

Referring to FIG. 10, the OLED display device 1000 is identical to the OLED device 800 illustrated in FIG. 8, except that the OLED display device 1000 of FIG. 10 is a bottom generation type OLED device, wherein light for displaying an image is generated at a bottom portion of the OLED device and is provided downwards. In FIG. 10, the same reference numerals denote the same elements as in FIG. 8, and detailed descriptions of same elements are omitted. The OLED display device 1000 includes a plurality of first electrodes 804 extending in a first direction, and a plurality of second electrodes 814 extending in a second direction perpendicular to the first direction to form the plurality of sub-pixels within the first electrodes. The organic light-emitting layer 812, interposed between first and second electrodes includes RGB OLED sub-pixels 816, 818, and 820 respectively.

A support 1020 may be positioned below the second electrode 814 to support the second electrode 814. The support 1020 may include a plurality of switching elements (not shown) for selectively controlling electrical signals to the second electrodes. In an active-matrix control scheme (as illustrated) a thin film transistor (TFT) 1030 is used as a switching element and the second electrode is an anode, and the first electrode is a cathode. It should be understood that in other control schemes, other configurations are utilized, including passive-matrix, and therefore the present invention is not limited to an AMOLED device The support 1020 includes the substrate 802, a plurality of insulating layers 1002, 1004, 1006, and 1008, and a plurality of TFTs 1030 for transferring electrical signals to each of the second electrodes 814. In accordance with the preferred embodiment, the substrate 802 is transparent so as to allow light generated by the device to pass therethrough and may include, for example, material such as glass, plastic, quartz, or the like. A substrate insulation layer 1002 is coated onto the surface of the substrate 802 for electrically isolating the substrate 802

A plurality of active layers 1032 of the TFT are positioned on an upper surface of the substrate insulation layer 1002. Each of the active layers corresponds to one of the plurality of second electrodes 814 respectively. The active layer includes a source portion 1032A, a channel portion 1032B, and a drain portion 1032C. A gate insulation layer 1004 is coated onto the substrate and active layer, and a portion is removed thereby leaving a raised gate insulation layer 1004. The gate insulation layer 1004 planarizes the upper surface of the substrate 802 and the stepped portion of the active layer 1032. A gate electrode 1034 is positioned on the gate insulation layer 1004 in vertical alignment with the channel portion 1032B of the active layer 1032. A first insulation layer 1006 is applied to the gate electrode 1034 and gate insulation layer 1004 to planarize the upper surface of the gate insulation layer 1004 and the stepped portion of the gate electrode 1034. A source electrode 1036 and a drain electrode 1038 are positioned on the planarized gate insulation layer 1004 corresponding to the source and drain portions 1032A, 1032C of the active layer 1032 respectively. When a data signal is applied to the source electrode 1032A, the drain electrode 1032C makes electrical contact with the source electrode 1032A in accordance with the voltage of the signal applied to the gate electrode 1034. A portion of the gate insulating layer 1004 covering the source and drain portions is opened and the source and drain electrodes 1036, 1038 make electrical contact with the source and drain portions 1032A, 1032C respectively. It is to be understood that a single layer gate electrode is described for illustrative purposes and that double, triple, multi-layer, or other configurations of gate electrodes known to one of ordinary skill in the art may utilized. A second insulation layer 1008 is applied to the first insulation layer 1006 and source and drain electrodes 1036, 1038 to planarize the upper surface of the first insulation layer 1006 and the stepped source and drain electrodes 1036, 1038. The second electrode 814 is positioned on the second insulation layer 1008. A portion of the second insulation layer covering the drain electrode 1038 is opened to form a via hole or contact hole 1040

A conductive oxide material is filled into the contact hole 1040 to form a pixel electrode 1040. The pixel electrodes 1040 are generally connected to the drain electrodes 1038 through the via holes 1042 formed in the second insulation layer 1008. The second electrode 814 makes electrical contact with the drain electrode 1038 through the pixel electrode 1040. The second electrode 814 can be formed at the same time with the pixel electrode 1040. The gate voltage applied to the gate electrode controls the current passing to the second electrode.

The first electrode 804, which functions in this embodiment as a cathode, is formed on the organic light-emitting layer and protects the organic light-emitting layer from disturbances and moisture. The first electrode 804 can include a metal that has low ionization potential and a low work function. A protective layer can also be coated on the first electrode to protect the first electrode.

Figure 11:
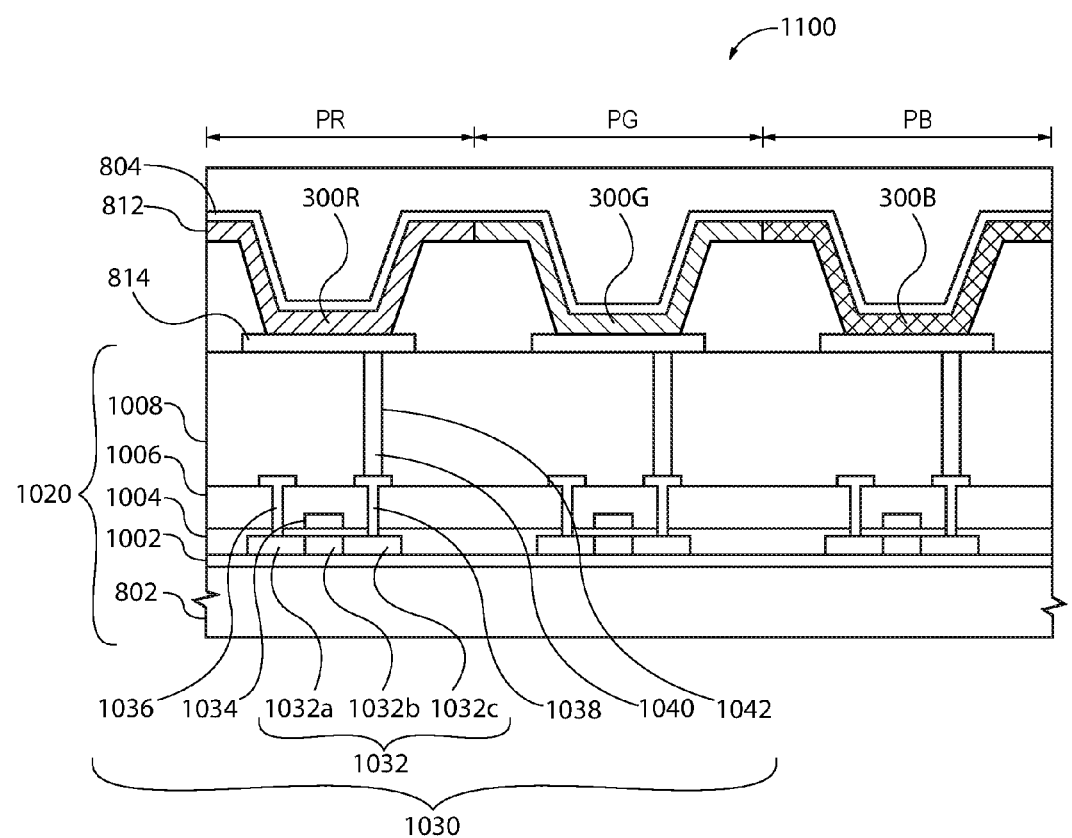
FIG. 11 is a cross-sectional view of a top-emitting OLED display device forming a full color image with independent red, green, and blue layer structure, in accordance with another embodiment of the present invention.

Referring to FIG. 11, the OLED display device 1100 is identical to the OLED device 1000 illustrated in FIG. 10, except that the OLED display device of FIG. 10 is a top generation type OLED display device, wherein light for displaying an image is generated at a top portion of the OLED display device and is provided upwards. In FIG. 11, the same reference numerals denote the same elements as in FIG. 10, and detailed descriptions of same elements are omitted. As the OLED device of FIG. 11 is top type, the first and second electrodes function as the anode and cathode respectively.

According to this embodiment, the first electrode 804 is a transparent electrode, for example, indium tin oxide (ITO), for allowing light generated in the light-emitting layer to pass upwardly therethrough. A transparent sealing layer can be formed on the first electrode for protecting the electrode from disturbances and moisture. The second electrode 814, which functions as the cathode, can include a metal that have a low ionization potential and low work function. Unlike the bottom generation type OLED display illustrated in FIG. 10, the hole-injecting layer and hole-transporting layer can formed between the first electrode 804 and organic light-emitting layer 812, and the electron-transporting layer can be formed between the second electrode 814 and the organic light-emitting layer 812. The organic light-emitting layer 812 is independently coated using RGB OLED layers, which are deposited and patterned using a shadow mask.

Figure 12:
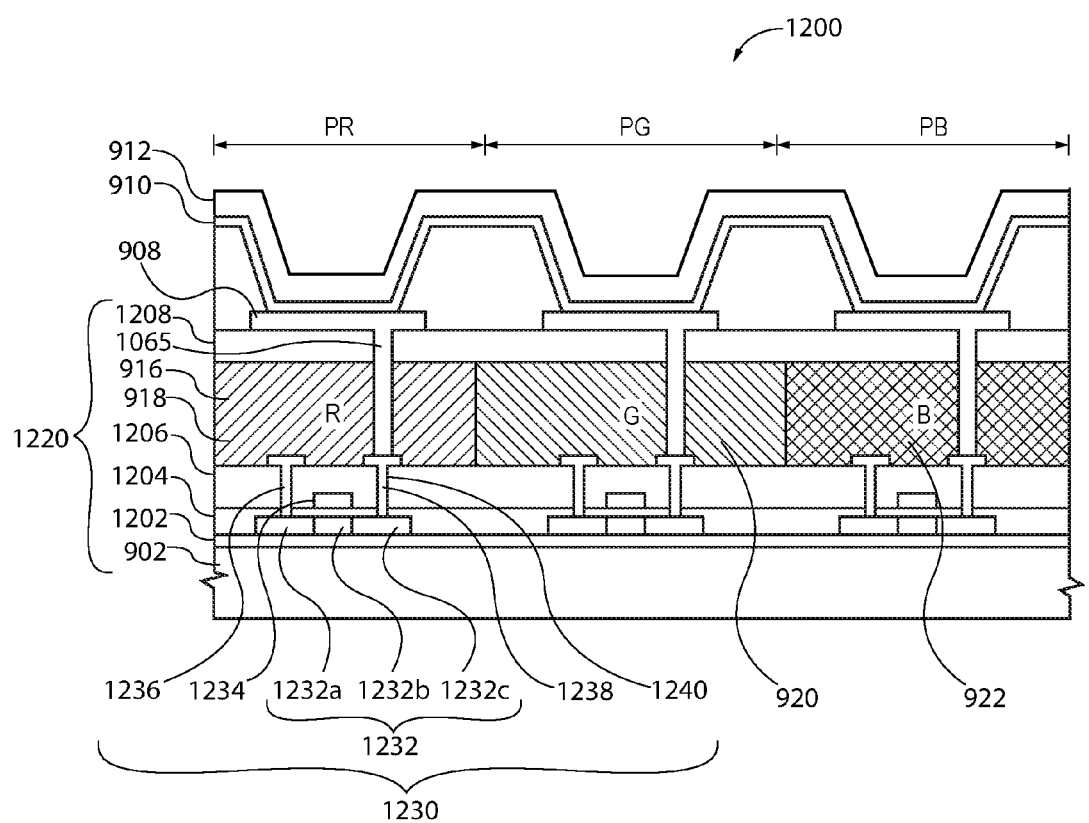
FIG. 12 is a cross-sectional view of a bottom-emitting OLED display device forming a full color image with a color filter structure, in accordance with another embodiment of the present invention.

Hereinafter, an OLED display device identical to FIG. 9 is described, wherein the color filter is formed through a conventional photolithography process, except that the OLED display device 1200 of FIG. 12 is a bottom generation type OLED device, wherein light for displaying an image is generated at a bottom portion of the OLED device and is provided downwards. In FIG. 12, the same reference numerals denote the same elements as in FIG. 9, and detailed descriptions of same elements are omitted. The OLED display device 1200 includes a plurality of first electrodes 912 extending in a first direction, and a plurality of second electrodes 908 extending in a second direction perpendicular to the first direction to form the plurality of sub-pixels within the first electrodes 912. The organic light-emitting layer 910, interposed between first and second electrodes 912, 908 includes RGB OLED color filter layer 916 for individually emitting red, green, and blue light by filtering the light from the bottom portion of the OLED display device.

A support 1220 may be positioned below the second electrode 908 to support the second electrode 908. The support 1220 may include a plurality of switching elements (not shown) for selectively controlling electrical signals to the second electrodes. In an active-matrix control scheme (as illustrated) a thin film transistor (TFT) is used as a switching element and the second electrode is an anode, and the first electrode is a cathode. It should be understood that in other control schemes, other configurations are utilized, including passive-matrix, and therefore the present invention is not limited to an AMOLED device.

The support 1220 includes the substrate 902, a plurality of insulating layers 1202, 1204, 1206, 1208, and a plurality of TFTs 1230 for transferring electrical signals to each of the second electrodes 908. In accordance with the preferred embodiment, the substrate 902 is transparent so as to allow light generated by the device to pass therethrough and may include, for example, material such as glass, plastic, quartz, or the like. A substrate insulation layer 1202 is coated onto the surface of the substrate for electrically isolating the substrate.

A plurality of active layers 1232 of the TFT are positioned on an upper surface of the substrate insulation layer 1202. Each of the active layers 1232 corresponds to one of the plurality of second electrodes 908 respectively. The active layer 1232 includes a source portion 1232A, a channel portion 1232B, and a drain portion 1232C. A gate insulation layer 1204 is coated onto the substrate 902 and active layer 1232, and a portion is removed thereby leaving a raised gate insulation layer. The gate insulation layer 1204 planarizes the upper surface of the substrate 902 and the stepped portion of the active layer 1232. A gate electrode 1234 is positioned on the gate insulation layer 1204 in vertical alignment with the channel portion 1232B of the active layer 1232. A first insulation layer 1206 is applied to the gate electrode 1234 and gate insulation layer 1204 to planarize the upper surface of the gate insulation layer 1204 and the stepped portion of the gate electrode. A source electrode 1236 and a drain electrode 1238 are positioned on the planarized gate insulation layer 1204 corresponding to the source and drain portions 1232A, 1232C of the active layer respectively. When a data signal is applied to the source electrode 1236, the drain electrode 1238 makes electrical contact with the source electrode 1236 in accordance with the voltage of the signal applied to the gate electrode. A portion of the gate insulating layer 1204 covering the source and drain portions 1232A, 1232C is opened and the source and drain electrodes 1236, 1238 make electrical contact with the source and drain portions 1232A, 1232C respectively. It is to be understood that a single layer gate electrode is described for illustrative purposes and that double, triple, multi-layer, or other configurations of gate electrodes known to one of ordinary skill in the art may utilized.

The color filter layer 916 is coated on the first insulation layer 1206. The color filter layer 916 is patterned through a photolithography process such that each of the sub-pixels emits one light color among red, green, and blue. The color filter layer 916 includes a red filter 918 for emitting red light, a green filter 920 for emitting green light, and a blue filter 922 for emitting blue light. The sub-pixel corresponding to the red filter is red sub-pixel, the sub-pixel corresponding to the green filter is green sub-pixel, and the sub-pixel corresponding to the blue filter is blue sub-pixel. A second insulation layer 1208 is applied to color filter layer 916 to planarize the upper surface of the color filter layer 916. The second electrode 908 is positioned on the surface of the planarized second insulation layer 1208. In one example, the second insulation layer 1208 may be an organic resin layer. A portion of the second insulation layer 1208 and color filter layer 916 covering the drain electrode 1238 is opened to form a via hole or contact hole 1240. A conductive oxide material is filled into the contact hole to form a pixel electrode 1240. The pixel electrodes 1240 are generally connected to the drain electrodes 1238 through the via holes formed in the second insulation layer. The second electrode 1238 makes electrical contact with the drain electrode through the pixel electrode 1040. The gate voltage applied to the gate electrode controls the current passing to the second electrode.

A driving voltage is applied to first and second electrodes, such that the plurality of electrons and holes are emitted into the organic light-emitting layer from the cathode and anode respectively. Once in the organic light-emitting layer 916, the electrons and holes recombine to emit light. A hole-injecting layer and a hole-transporting layer can be formed between the second electrode 908 and the organic light-emitting layer 916, and an electron-transporting layer can be formed between the first electrode 912 and the organic light-emitting layer 910.

The first electrode 912, which functions in this embodiment as a cathode, is formed over the organic light-emitting layer 916 and protects the organic light-emitting layer from disturbances and moisture. The first electrode 912 can include a metal that has low ionization potential and a low work function. A protective layer can also be coated on the first electrode to protect the first electrode.

Figure 13:
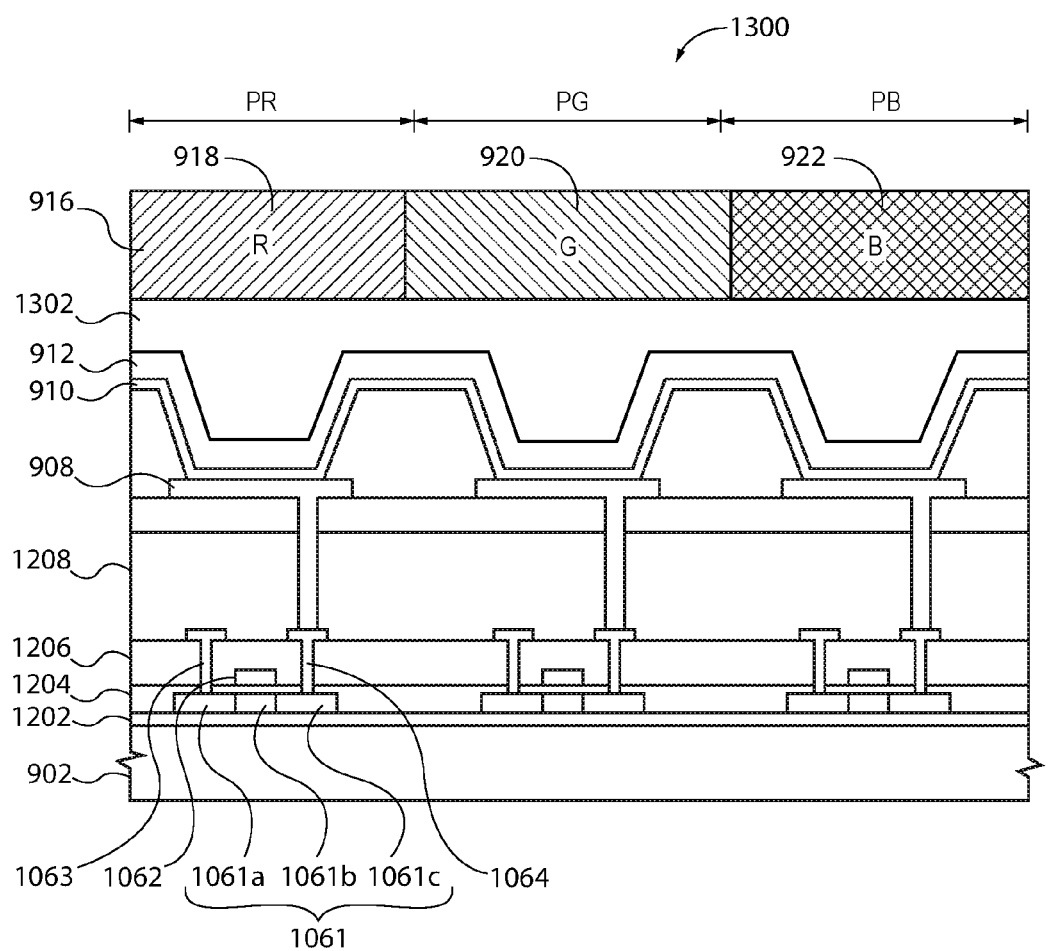
FIG. 13 is a cross-sectional view of a top-emitting OLED display device forming a full color image with a color filter structure, in accordance with another embodiment of the present invention.

Referring to FIG. 13, the OLED display device is identical to the OLED display device illustrated in FIG. 12, except that the OLED display device 1200 of FIG. 12 is a top generation type OLED display device, wherein light for displaying an image is generated at a top portion of the OLED display device and is provided upwards. In FIG. 13, the same reference numerals denote the same elements as in FIG. 12, and detailed descriptions of same elements are omitted. As the OLED display device of FIG. 13 is top generation type, the first and second electrodes 912, 908 function as the anode and cathode respectively.

According to this embodiment, the first electrode 912 is a transparent electrode, for example, indium tin oxide (ITO), for allowing light generated in the light-emitting layer to pass upwardly therethrough. A transparent sealing layer 1302 can be formed on the first electrode 912 for protecting the electrode from disturbances and moisture. The second electrode 908, which functions as the cathode, can include a metal that have a low ionization potential and low work function. Unlike the bottom generation type OLED display illustrated in FIG. 12, the hole-injecting layer and hole-transporting layer can formed between the first electrode 912 and organic light-emitting layer 916, and the electron-transporting layer can be formed between the second electrode 908 and the organic light-emitting layer 916.

According to this embodiment, the color filter layer 916 is coated on the transparent sealing layer 1302. The color filter layer 916 is patterned through a photolithography process such that each of the sub-pixels emits one light color among red, green, and blue. The color filter layer includes a red filter 918 for emitting red light, a green filter for emitting green light 920, and a blue filter 922 for emitting blue light. The sub-pixel corresponding to the red filter is red sub-pixel, the sub-pixel corresponding to the green filter is green sub-pixel, and the sub-pixel corresponding to the blue filter is blue sub-pixel. The color filter type OLED display device described in connection with FIGS. 12 and 13, can be manufactured without the use of a shadow mask.

It is to be understood that the disclosure describes a few embodiments and that many variations of the invention can easily be devised by those skilled in the art after reading this disclosure and that the scope of the present invention is to be determined by the following claims.

What is claimed is:

1. An organic light-emitting diode (OLED) display device, comprising:
   a color emission layer including a plurality of organic light-emitting elements in a first arrangement; and
   an electronics layer including a plurality of pixel drive circuits each including an electrode contact, wherein the electronics layer includes a plurality of independently addressable sub-regions each sub-region including an identical pattern of electrode contacts,
   wherein each sub-region is orientated differently within a plane, and
   wherein the first arrangement of light-emitting elements is electrically connected to the patterned electronics layer.

2. The OLED display device of claim 1, wherein the first arrangement the organic light-emitting elements are arranged in a vertically repetitive sequence across the entire color emission layer.

3. The OLED display device of claim 1, wherein the pixel circuit is a single-crystal silicon circuit.

4. The OLED display device of claim 1, wherein each sub-region of the electronics layer is an OLED microdisplay panel.

5. The OLED display device of claim 4, wherein each microdisplay panel includes a plurality of logic blocks and a plurality of fixed resource blocks.

6. The OLED display device of claim 1, wherein adjacent sub-regions of the electronics layer are orientated differently in the plane by flipping about the axis of symmetry.

7. The OLED display device of claim 1, wherein adjacent sub-regions of the electronics layer are orientated differently in the plane by rotating ninety degrees therefrom.

8. The OLED display device of claim 1, wherein each sub-region of the electronics layer includes a pattern of electrode contacts electrically connected to provide conduction to individual OLED elements within the emission layer.

9. The OLED display device of claim 8, wherein the pattern of electrode contacts is arranged along a diagonal across each OLED element.

10. The OLED display device of claim 1, wherein the OLED elements include an array of light-emitting pixels having organic layers, which produce colors defining a color gamut.

11. The OLED device of claim 10, wherein the colors produced by the color gamut defining pixels are red, green and blue.

12. The OLED device of claim 10, further comprising a different color filter associated with each of the color gamut defining pixels.

13. The OLED display device of claim 1, wherein each pattern of the sub-region of the electronics later is created using a single reticle exposure.

14. The OLED display device of claim 1, wherein the device is an active matrix device.

15. The OLED display device of claim 1, wherein the device is a passive matrix device.

16. The OLED display device of claim 1, wherein the device is a top emitting.

17. The OLED display device of claim 1, wherein the device is bottom emitting.

18. A method of manufacturing an organic light-emitting diode display device, comprising:

assembling a plurality of independently addressable display panels in an array, each of the panels having a color emission layer including a plurality of organic light-emitting elements each having a contact and patterned in a first arrangement;

assembling an electronics layer having a plurality of differently orientated sub-regions created using a single reticle exposure, comprising:

forming a plurality of single-crystal silicon pixel drive circuits adapted to provide a plurality of electrical signals for activating one of the plurality of corresponding organic light-emitting elements of the color emission layer;

forming a plurality of electrode contacts coupled to receive the plurality of electrical signals provided by the pixel drive circuitry; and forming a plurality of vias for coupling the plurality of electrode contacts to the plurality of the organic light-emitting element contacts; and coupling the patterned first arrangement of light-emitting elements to the patterned electronics layer by the plurality of vias.

19. The method according to claim 18, wherein forming a plurality of electrode contacts further comprising: forming a conductive layer on a transparent substrate; and etching the conducting layer to produce an electrode pattern by means of photolithography so as to form a plurality of electrodes on the transparent substrate.

20. The method according to claim 19, wherein the pattern of electrodes aligns with the patterned first arrangement of light-emitting elements of the color emission layer.

21. The method according to claim 18, wherein the electronics layer is produced using small area photo exposure tools including a mask.

22. The method according to claim 18, wherein the electronics layer is formed using continuous die patterning.

* * * * *